US006344762B1

(12) United States Patent
Prentice

(10) Patent No.: US 6,344,762 B1
(45) Date of Patent: Feb. 5, 2002

(54) BIAS CIRCUIT FOR A LOW VOLTAGE DIFFERENTIAL CIRCUIT

(75) Inventor: John S. Prentice, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/747,321

(22) Filed: Dec. 21, 2000

(51) Int. Cl.$^7$ ............................................... H03K 5/22
(52) U.S. Cl. ........................ 327/65; 327/307; 330/361
(58) Field of Search .......................... 327/52, 65, 307; 327/563; 330/261, 258

(56) References Cited

U.S. PATENT DOCUMENTS

| | | | | |
|---|---|---|---|---|
| 4,580,106 A | * | 4/1986 | Vittoz | 330/261 |
| 5,185,582 A | * | 2/1993 | Barbu | 330/261 |
| 5,488,330 A | * | 1/1996 | Masuoka et al. | 330/361 |
| 6,023,196 A | * | 2/2000 | Ashby et al. | 330/290 |

OTHER PUBLICATIONS

A. Abidi, "Direct–Conversion Radio Transceivers for Digital Communications", *IEEE Journal of Solid–State Circuits*, vol. 30, No. 12, Dec. 1995, pp. 1399–1410.
B. Razavi, "Design Considerations for Direct–Conversion Receivers", *IEEE Transactions on Circuits and Systems—II: Analog and Digital Signal Processing*, vol. 44, No. 6, Jun. 1997, pp. 428–435.
J. Cavers et al., "Adaptive Compensation for Imbalance and Offset Losses in Direct Conversion Transceivers", *IEEE Transactions on Vehicular Technology*, vol. 42, No. 4, Nov. 1993, pp. 581–588.
A. Bateman et al., "Direct Conversion Transceiver Design for Compact Low–Cost Portable Mobile Radio Terminals", *IEEE Veh. Tech. Conf.*, 1989, pp. 57–62.
S. Sampei et al., "Adaptive DC–Offset Compensation Algorithm for Burst Mode Operated Direct Conversion Receivers", IEEE Veh. Tech. Conf., 1992, pp. 93–96.

* cited by examiner

*Primary Examiner*—Terry D. Cunningham
(74) *Attorney, Agent, or Firm*—Gary R. Stanford

(57) ABSTRACT

A bias circuit that provides biasing for a differential circuit. The bias circuit includes first and second transistors, first and second impedance devices, a reference current source and an amplifier. The first and second transistors each have a control input and a current path coupled between a first node and ground, where the control inputs of the first and second transistors receive the differential signal. The impedance devices are each coupled between a control input of one of the first and second transistors and a second node. The reference current source provides a reference current for the first node and the amplifier has an input coupled to the first node and an output coupled to the second node. The transistors of the bias circuit and the differential circuit may be matched, NPN bipolar junction transistors with emitters connected to ground. A filter capacitor may be coupled between the first node and ground and operates as a low pass filter.

20 Claims, 3 Drawing Sheets

US 6,344,762 B1

BIAS CIRCUIT FOR A LOW VOLTAGE DIFFERENTIAL CIRCUIT

FIELD OF THE INVENTION

The present invention relates to differential circuits and techniques, and more particularly to a bias circuit for low voltage differential applications.

DESCRIPTION OF RELATED ART

The bipolar junction transistor (BJT) differential pair is one of the most important integrated circuit (IC) building blocks. The emitters of two NPN BJ transistors Q1, Q2 are connected together and to a constant current sink to ground. The supply voltage is connected to the collectors of the transistors through separate bias resistors, which may have matching resistances. A differential input signal ($V_{IN+}$, $V_{IN-}$) is applied across the bases of the differential pair, and a differential output voltage ($V_{OUT+}$, $V_{OUT-}$) is developed across the collectors of the differential pair. The current sink establishes a bias current $I_{BIAS}$ that sets the total of the sum of emitter currents for transistor differential pair Q1 and Q2. Usually, the base currents are relatively small (i.e., high current gain) so the sum of the collector currents ($I_{C1}$ and $I_{C2}$) of the transistors Q1 and Q2 is also equal to the current from the current sink. This results in the well-known hyperbolic tangent function "tanh" for the differential collector currents as illustrated by the following equations 1 and 2:

$$(I_{C1}+I_{C2})=I_{BIAS} \quad \text{(EQ 1)}$$

$$(I_{C1}-I_{C2})=(I_{BIAS}) \tanh [V_D/2V_T], V_D=(V_{IN+}-V_{IN-}) \quad \text{(EQ 2)}$$

where $V_T$ is a thermal coefficient voltage (the voltage equivalent of temperature), where $V_T$=kT/q, where "k" is the Boltzmann constant in joules per degree Kelvin, T is the temperature in degrees Kelvin (absolute scale), and "q" is the magnitude of the charge of an electron.

The current sink bias sets the value of the sum of the collector currents of the transistors. The differential collector current depends upon the differential base voltages, but its maximum value is also limited by the current sink bias. A DC supply of base current is usually required for this circuit to work. Sometimes the DC base current is supplied by the signal source itself, but if the signal is AC coupled to the base, as is often the case for radio frequency (RF) circuits, for example, then a separate DC bias path is used to supply DC base current. In this case, the DC base bias circuit usually has an AC impedance value that is large compared to the impedance of the base terminals of the BJTs, so that little signal is lost to this base bias circuit.

For circuits operating with supply voltages less than 3 volts (V), the differential pair uses a large percentage of the total available supply voltage. The current sink itself may consume nearly a volt.

SUMMARY OF THE INVENTION

A bias circuit according to embodiments of the present invention provides biasing for a differential circuit, where the differential circuit includes a pair of differential transistors having control inputs receiving a differential signal and current paths coupled between a source signal and ground. The bias circuit includes first and second transistors, first and second impedance devices, a reference current source and an amplifier. The first and second transistors each have a control input and further have a current path coupled between a first node and ground. The control inputs of the first and second transistors receive the differential signal. The first and second impedance devices are each coupled between a control input of one of the first and second transistors and a second node. The reference current source provides a reference current for the first node and the amplifier has an input coupled to the first node and an output coupled to the second node. In this manner, the differential circuit need not include a constant current source in series with the differential transistors so that the differential circuit may be utilized in low voltage applications.

An inductor may be coupled in the current path of the differential transistors between the first and second transistors and ground. The impedance of an inductor is low at low frequencies and thus has little or no effect. The impedance of the inductor is, however, high at high frequencies. In this manner, the inductor operates in a similar manner as a constant current source at high frequencies so that the circuit responds in a similar manner as a standard differential circuit. A filter capacitor may be coupled between the first node and ground and operates as a low pass filter.

In more specific configurations, the first and second transistors each comprise a bipolar junction transistor (BJT) having a base input and further having a current path formed by a collector and an emitter. Also, the first and second transistors may each comprise NPN transistors. Also, the emitters of the differential transistors of the differential circuit and the first and second transistors may each be connected to ground. The differential transistors of the differential circuit may also be BJTs, where the first and second transistors have emitter area ratios that are matched to the emitter area ratios of the differential transistors of the differential circuit. It is noted that PNP or metal oxide semiconductor transistor (MOS) configurations are also contemplated.

The first and second impedance devices may be resistors or inductors. The reference current may be fixed, or may be modulated to make the circuit into a type of mixer or multiplier. Also, the impedance devices may be replaced by current sources or mixers, which are controlled by either of the first or second nodes. Further, additional pairs of transistors may be added to obtain additional pairs of output currents. Emitter generation may be added between each transistor emitter and ground. The amplifier may be a non-inverting amplifier, a buffer, an emitter-follower, or even a short circuit in some configurations.

A biased differential circuit according to the present invention includes first and second pairs of differential transistors, first and second resistors, first and second impedance devices, a reference current source and an amplifier. The first pair of differential transistors each has a control input and first and second current terminals, where the first terminal of each is coupled to ground and where the control inputs of the pair of differential transistors receive the differential input signal. The first and second resistors are each coupled between the source signal and the second current terminal of a respective one of the first pair of differential transistors. The second current terminals of the first pair of differential transistors develops a differential output signal. The second pair of differential transistors each have a control input and first and second current terminals coupled between a first node and ground. The control inputs of the second pair of differential transistors receive the differential input signal. The first and second impedance devices are each coupled between a control input of one of the second pair of differential transistors and a second node. The reference current source is coupled to the source signal and provides a reference current for the first node. The amplifier has an input coupled to the first node and an output coupled to the second node. The variations previously described are applicable in a similar manner.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF EMBODIMENT(S) OF THE INVENTION

Figure 1:
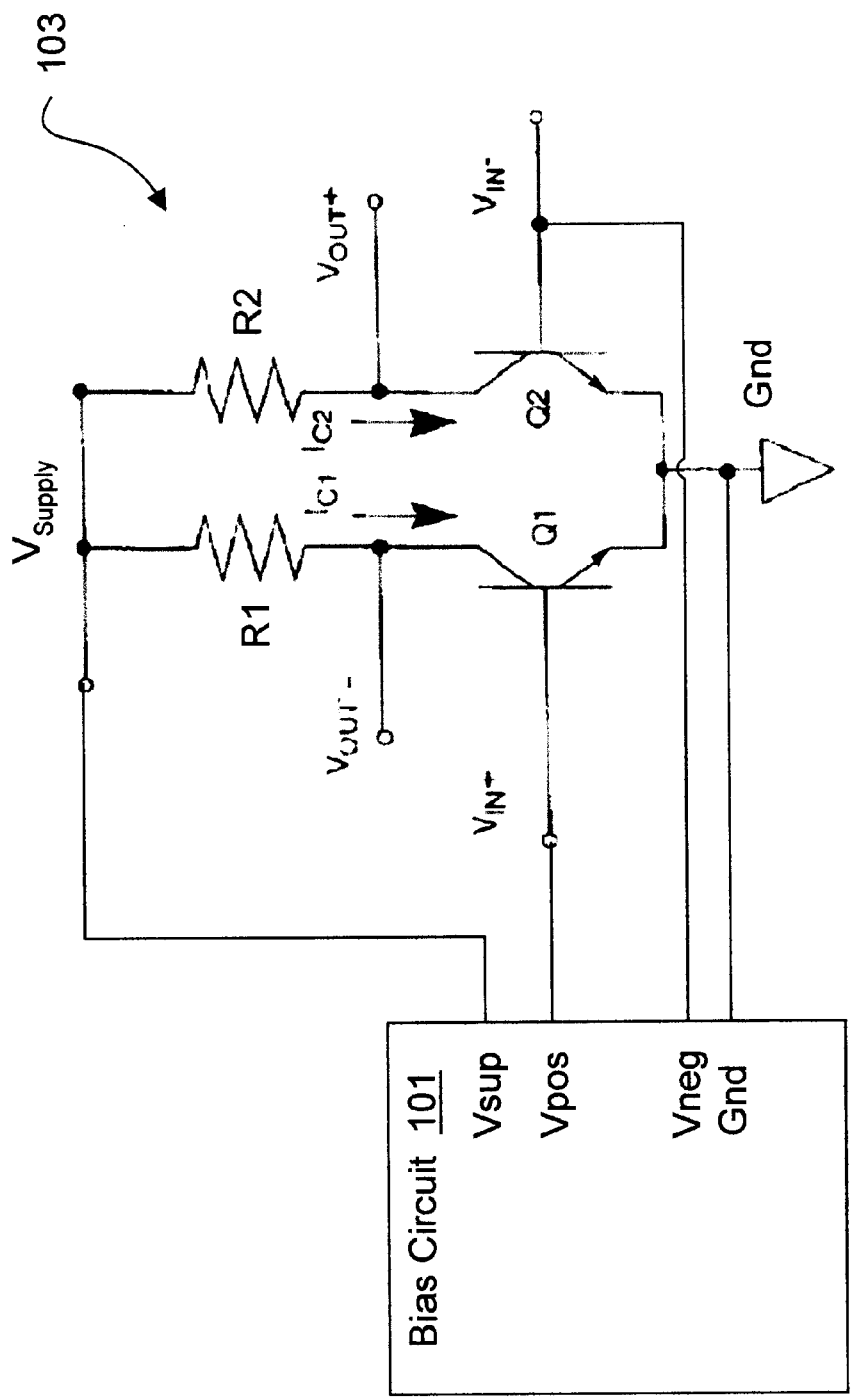
FIG. 1 is schematic and block diagram of a bias circuit for biasing a low voltage differential circuit.

FIG. 1 is schematic and block diagram of a bias circuit 101 for biasing a low voltage differential circuit 103. The differential circuit 103 is similar to a typical differential circuit except that the constant current bias sink is removed. In particular, the low voltage differential circuit 103 includes a differential pair of NPN bipolar junction transistors (BJT) Q1 and Q2 having their emitters connected together and to ground (Gnd). The supply voltage $V_{Supply}$ is connected to the collectors of the transistors through separate bias resistors R1 and R2, which may have matching resistances. A differential input signal ($V_{IN+}$, $V_{IN-}$) is applied across the bases and a differential output voltage ($V_{OUT+}$, $V_{OUT-}$) is developed across the collectors of the differential pair of transistors Q1 and Q2. The collector currents of the transistors Q1 and Q2 are $I_{C1}$ and $I_{C2}$, respectively.

It is noted that other types of transistors may be employed, such as metal oxide semiconductor (MOS) transistors, field effect transistors (FETs), PNP transistors, etc. The base of the NPN BJTs is considered an input or control terminal whereas the collectors and emitters form a controlled current path for each transistor. A similar analysis applies for MOS transistors or FETs, where the gate is an input or control terminal whereas the source and drain form a controlled current path.

The bias circuit 101 includes four terminals for coupling to the differential circuit 103. In particular, the bias circuit 101 includes "Vsup" and "Gnd" terminals for coupling to the $V_{Supply}$ and ground signals, respectively, for supplying voltage and reference. The bias circuit 101 also includes "Vpos" and "Vneg" terminals for coupling to the $V_{IN+}$ and $V_{IN-}$ signals, respectively, of the differential circuit 103. As described more fully below, the bias circuit 101 effectively replaces the constant current source typically coupled between the transistor emitters and ground and performs a similar function. The bias circuit 101, however, provides the benefit of eliminating the voltage drop that would otherwise exist across the current source, thereby providing a greater amount of voltage swing for the differential circuit 103. This is particularly beneficial for low voltage applications, such as when the $V_{Supply}$ signal is on the order of 3 volts (V) or less. The bias circuit 101 also eliminates base current error that otherwise exists in typical emitter-coupled, differential pair circuits since the collector currents in the typical circuits are smaller than the emitter currents by the amount of the base current.

Figure 2:
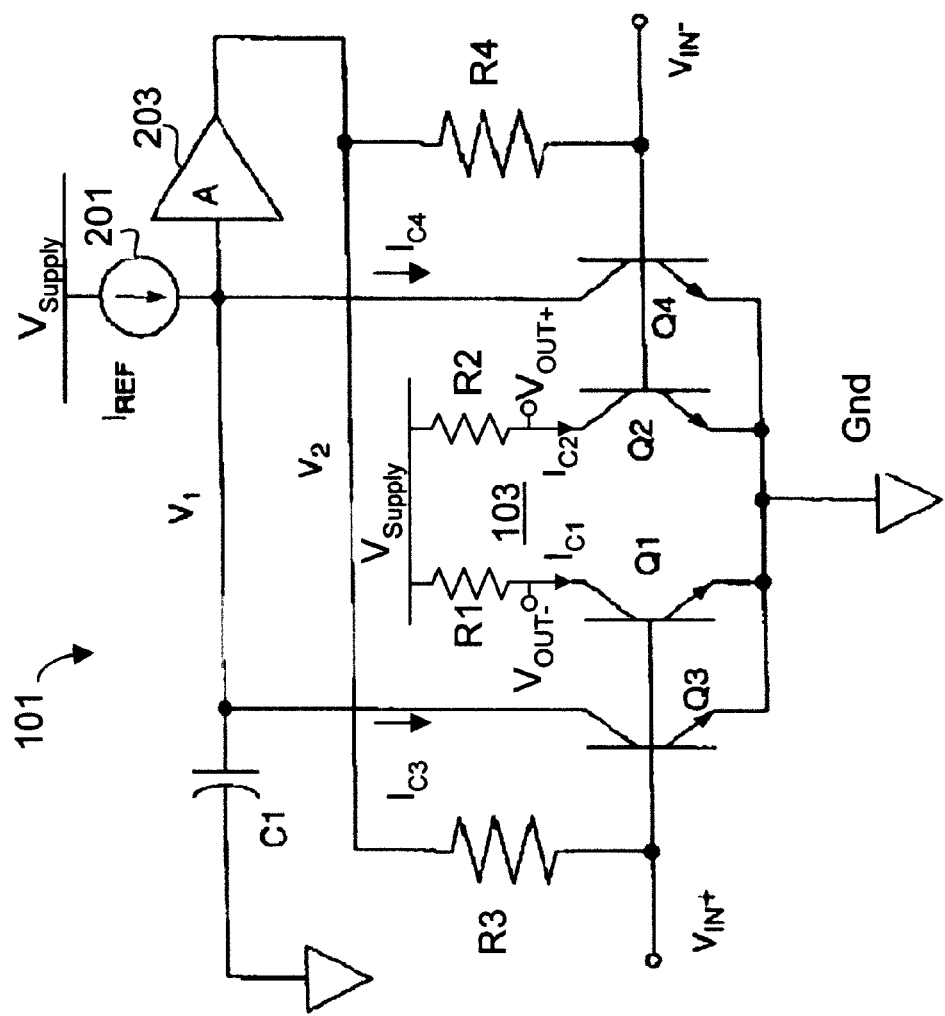
FIG. 2 is a schematic diagram of an exemplary embodiment of the bias circuit of FIG. 1 coupled to the differential circuit.

FIG. 2 is a schematic diagram of an exemplary embodiment of the bias circuit 101 coupled to the differential circuit 103. The differential circuit 103 is essentially identical with the same elements Q1, Q2, R1 and R3 coupled between the $V_{Supply}$ and ground signals in the same manner. In the embodiment shown, the bias circuit 101 includes two BJTs Q3 and Q4, two resistors R3 and R4, a constant current source 201 asserting a reference current $I_{REF}$, a non-inverting amplifier 203 and an optional filter capacitor C1. In the particular configuration shown, the transistors Q3 and Q4 are coupled to the transistors Q1 and Q2 with their emitters coupled to ground. The base of the transistor Q3 is coupled to the base of the transistor Q1 for receiving the $V_{IN+}$ signal. The base of the transistor Q4 is coupled to the base of the transistor Q2 for receiving the $V_{IN-}$ signal. The collectors of the transistors Q3 and Q4 are both coupled to a voltage node $V_1$ (with voltage $V_1$). The resistor R3 is coupled between the base of the transistor Q3 and another voltage node $V_2$ (with voltage $V_2$), and the resistor R4 is coupled between the base of the transistor Q4 and the $V_2$ node. The current source 201 is coupled between the $V_{Supply}$ signal and the $V_1$ node for injecting the $I_{REF}$ current into the $V_1$ node. The amplifier 203 has its input coupled to the $V_1$ node and its output coupled to the $V_2$ node. The optional capacitor C1 is coupled between the $V_1$ node and ground.

In the embodiment shown, the transistors Q1–Q4 are substantially similar or otherwise identical. It is desired that the DC impedance (resistance) of the sources (driving $V_{IN+}$ and $V_{IN-}$) be finite and preferably large. For example, it is sufficient if the sources are AC coupled, such as connected through capacitors or the like, to the bases of the transistors Q1 and Q2. In addition, it is generally desirable that the impedance of the bias circuit 101, including the resistors R3 and R4, be large compared to the source and/or base impedance of the transistors Q3 and Q4 at signal frequencies. Exemplary signal frequencies are in the gigahertz (GHz) frequency range.

In operation, the sum of the collector currents $I_{C3}$ and $I_{C4}$ of the transistors Q3 and Q4 is compared to the desired reference current $I_{REF}$. The difference between the collector current sum ($I_{C3}+I_{C4}$) and the reference current $I_{REF}$ is converted to an error voltage or current by the amplifier 203, where the error is applied back to the bases of the transistors Q3 and Q4 through isolating impedances established by the resistors R3 and R4. Assuming the transistors Q1–Q4 are similar, then the collector currents $I_{C1}$ and $I_{C3}$ are approximately equal, and the collector currents $I_{C2}$ and $I_{C4}$ are also approximately equal. The reference current $I_{REF}$ flows into the $V_1$ node and the collector currents $I_{C3}$ and $I_{C4}$ flow out of this same node $V_1$. If the reference current $I_{REF}$ is larger than the sum of the collector currents $I_{C3}$ and $I_{C4}$, then the node voltage $V_1$ becomes more positive, which causes the node voltage $V_2$ to also become more positive through operation of the amplifier 203. At any moment in time, the input voltages $V_{IN+}$ and $V_{IN-}$ may not be equal. As the node voltage $V_2$ becomes more positive, however, the current through R3 and R4 increases so that the average input voltage becomes more positive. As the average input voltage becomes more positive, the sum of the collector currents $I_{C3}$ and $I_{C4}$ becomes greater. The circuit stabilizes when the sum of the collector currents $I_{C3}$ and $I_{C4}$ equals the reference current $I_{REF}$. This feedback loop continuously maintains the average input voltage even in the presence of separately varying inputs.

The optional capacitor C1 returns net alternating current (AC) from the collector currents $I_{C3}$ and $I_{C4}$ to ground thereby acting as a low pass filter. The amplifier 203 may be replaced by a buffer, such as an emitter-follower or the like, or, in some instances, may be replaced by a short-circuit so that the nodes $V_1$ and $V_2$ are the same.

For low frequency operation, such as when the variation of the input voltage $V_{IN+}$ and $V_{IN-}$ is slow relative to the bias feedback loop, then at each instant of time the following equations 3–8 illustrate operation:

$$I_{C3}+I_{C4}=I_{REF}, I_{C1}=I_{C3}, I_{C2}=I_{C4} \qquad \text{(EQ 3)}$$

$$I_{C1}/I_{C2}=\exp[V_D/V_T], V_D=(V_{IN+}-V_{IN-}) \qquad \text{(EQ 4)}$$

$$I_{C1}/(I_{REF}-I_{C1})=\exp[V_D/V_T], I_{C2}/(I_{REF}-I_{C2})=\exp[-V_D/V_T] \qquad \text{(EQ 5)}$$

$$I_{C1}=(I_{REF}-I_{C1})\exp[V_D/V_T], I_{C2}=(I_{REF}-I_{C2})\exp[-V_D/V_T] \qquad \text{(EQ 6)}$$

$$I_{C1}(1+\exp[V_D/V_T])=(I_{REF})\exp[-V_D/V_T],$$

$$I_{C2}(1+\exp[-V_D/V_T])=(I_{REF})\exp[-V_D/V_T] \qquad \text{(EQ 7)}$$

$$I_{C1}=\{(I_{REF})\exp[V_D/V_T]\}/\{1+\exp[V_D/V_T]\},$$

$$I_{C2}=\{(I_{REF})\exp[-V_D/V_T]\}/\{1+\exp[-V_D/V_T]\} \qquad \text{(EQ 8)}$$

where "exp" is the exponential function (natural logarithm). It is also noted, according to the following equation 9, that:

$$(\exp[V_D/V_T])(\exp[-V_D/2V_T])=\exp[-V_D/2V_T] \qquad \text{(EQ 9)}$$

So, according to the following equation 10, it is true that:

$$I_{C1}=\{(I_{REF})\exp[V_D/2V_T]\}/\{\exp[-V_D/2V_T]+\exp[V_D/2V_T]\},$$

$$I_{C2}=\{(I_{REF})\exp[-V_D/2V_T]\}/\{\exp[V_D/2V_T]+\exp[-V_D/2V_T]\} \qquad \text{(EQ 10)}$$

Calculating the differential current results in the following equation 11:

$$I_{C1} - I_{C2} = (I_{REF})\{\exp[V_D/2V_T] - \exp[-V_D/2V_T]\}/ \qquad \text{(EQ 11)}$$
$$\{\exp[V_D/2V_T] + \exp[-V_D/2V_T]\}$$
$$= (I_{REF})\tanh(V_D/2V_T)$$

This is a similar function as the common differential pair biased with a current sink, except that there is no base current error for the bias circuit 101.

The bias circuit 101 interacts with the input signals $V_{IN+}$ and $V_{IN-}$ to transform the effective input into a differential signal. For example, suppose a positive going signal was applied to the positive input $V_{IN+}$ but no signal was applied to the negative input $V_{IN-}$. The bias circuit 101 adjusts the voltage on both bases in the negative direction so that the base voltage at Q2 goes negative by the amount of half the value of the applied signal and that the base voltage at Q1 goes positive by only half the applied input.

For high frequency operation, such as when the input changes faster than the feedback circuit can follow, then the bias circuit 101 acts to maintain the average (or DC) of the sum of the collector currents equal to the reference current $I_{REF}$. For low amplitude inputs (such as below the thermal coefficient voltage $V_T$), the transistors Q1 and Q2 respond independently to their respective inputs, i.e., the collector current $I_{C1}$ depends only upon the input voltage $V_{IN+}$ and the collector current $I_{C2}$ depends only upon the input voltage $V_{IN-}$ with the DC bias equal to half of the reference current $I_{REF}$. In many applications, the input voltages $V_{IN+}$ and $V_{IN-}$ are differential in nature so the collector currents are also differential.

A large amplitude input (such as greater than the thermal coefficient voltage $V_T$) applied to the base of one of the transistors Q1, Q2 increases the DC bias of that transistor. The bias circuit 101 senses the increase in DC and reduces the DC voltage at the bases of all the transistors Q1–Q4. In this manner, the input voltage on one side affects the collector currents on the other side. Since the bias circuit 101 fixes the average current, it is useful for converting large amplitude sine waves into square waves.

Figure 3:
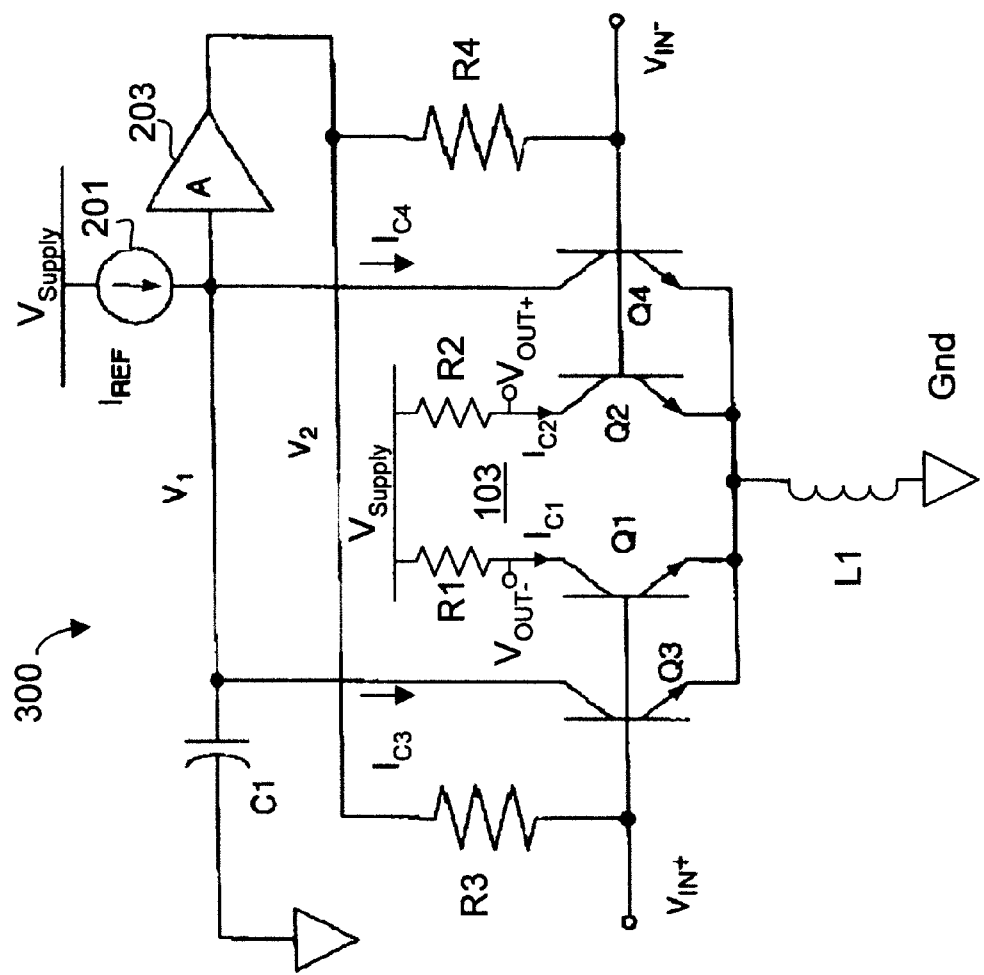
FIG. 3 is a schematic diagram of another exemplary embodiment of the bias circuit, which includes an inductor connected between the emitters of the emitter-coupled transistors and ground.

FIG. 3 is a schematic diagram of a bias circuit 300, which is similar to the bias circuit 101 with the addition of an inductor L1 connected between the emitters of the transistors Q1, Q2, Q3, Q4 and ground. The impedance of the inductor L1 is low at low frequencies and high at high frequencies. At low frequencies, the bias circuit 300 operates as described previously since the inductor L1 has no effect. At high frequencies, however, the impedance of the inductor L1 acts like a constant current source and the bias circuit 300 responds in a similar manner as a traditional emitter-coupled, differential circuit configuration.

Many other variations and embodiments of the bias circuits 101 and 300 are possible and useful and are within the scope of the present invention. In one variation, the transistor emitter area ratios (Q1/Q3) are modified to other than 1:1 to scale the Q1/Q2 bias current relative to the reference current $I_{REF}$. In another variation, additional pairs of transistors are added to obtain more than one pair of output currents. In another variation, emitter degeneration can be added between each emitter and ground. In another variation, the resistors R3 and R4 are replaced by inductors. In another variation, the resistors R3 and R4 are replaced by current sources or current mirrors which are controlled by the voltages $V_1$ or $V_2$. In another variation, the NPN transistors are replaced by PNP transistors. In another variation, the BJTs are replaced by metal oxide semiconductor (MOS) transistors or the like. In another variation, the reference current $I_{REF}$ is modulated for mixer or multiplier type operation. Of course, any one or more of these variations may be combined for achieving additional embodiments without going beyond the spirit and scope of the present invention.

It is appreciated that a bias circuit in accordance with one or more embodiments of the present invention is suitable for providing bias functions for a differential circuit. The standard constant current sink is eliminated thereby enabling a greater signal voltage swing, which is particularly advantageous for low voltage applications. The bias circuit generally operates in parallel with the differential circuit rather than the series configuration required by the current sink. The bias circuit also eliminates base current error, and has many other useful functions depending upon frequency of operation.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A bias circuit for a differential circuit, the differential circuit including a pair of differential transistors having control inputs receiving a differential signal and controlled current paths coupled between a source signal and ground, the bias circuit comprising:

first and second transistors, each having a current path coupled between a first node and ground and a control input, the control inputs of the first and second transistors for receiving the differential signal;

first and second impedance devices, each coupled between a control input of one of the first and second transistors and a second node;

a reference current source, coupled to the source signal, that provides a reference current for the first node; and an amplifier having an input coupled to the first node and an output coupled to the second node.

2. The bias circuit of claim 1, further comprising an inductor coupled in the current path between the first and second transistors and ground.

3. The bias circuit of claim 1, further comprising a filter capacitor coupled between the first node and ground.

4. The bias circuit of claim 1, wherein the first and second transistors each comprise a bipolar junction transistor (BJT) having a controlled current path between a collector and an emitter and having a base input.

5. The bias circuit of claim 4, wherein the first and second transistors each comprise an NPN BJT.

6. The bias circuit of claim 5, wherein the emitters of the differential transistors of the differential circuit and the first and second transistors are connected to ground.

7. The bias circuit of claim 4, wherein the differential transistors of the differential circuit are also BJTs, further comprising:

the first and second transistors having emitter area ratios that are matched to the emitter area ratios of the differential transistors of the differential circuit.

8. The bias circuit of claim 1, wherein the first and second transistors comprise metal oxide semiconductor (MOS) type transistors.

9. The bias circuit of claim 1, wherein the first and second impedance devices comprises resistors.

10. The bias circuit of claim 1, wherein the first and second impedance devices comprises inductors.

11. The bias circuit of claim 1, wherein the reference current of the reference current source is modulated.

12. The bias circuit of claim 1, wherein the differential circuit comprises additional pairs of transistors to achieve multiple differential outputs.

13. A biased differential circuit, comprising:

a first pair of differential transistors, each having a control input and first and second current terminals, wherein the first terminal of each is coupled to ground and wherein the control inputs of the pair of differential transistors receive a differential input signal;

first and second resistors, each coupled between a source signal and the second current terminal of a respective one of the first pair of differential transistors, wherein the second current terminals of the first pair of differential transistors develops a differential output signal;

a second pair of differential transistors, each having a control input and first and second current terminals coupled between a first node and ground, the control inputs of the second pair of differential transistors receiving the differential input signal;

first and second impedance devices, each coupled between a control input of one of the second pair of differential transistors and a second node;

a reference current source coupled to the source signal and provides a reference current for the first node; and an amplifier having an input coupled to the first node and an output driving the second node.

14. The biased differential circuit of claim 13, wherein each transistor of the first and second pair of differential transistors comprise NPN bipolar junction transistors having emitters connected to ground.

15. The biased differential circuit of claim 14, wherein each of the transistors of the first and second pair of differential transistors have matching emitter area ratios.

16. The biased differential circuit of claim 14, wherein the first and second impedance devices comprise matching resistors.

17. The biased differential circuit of claim 15, further comprising:

a filter capacitor coupled between the first node and ground.

18. The biased differential circuit of claim 17, wherein the amplifier is a non-inverting amplifier.

19. The biased differential circuit of claim 13, wherein each transistor of the first and second pair of differential transistors comprises an NPN bipolar junction transistors in which the first and second current terminals comprise emitter and collector terminals, respectively, the biased differential circuit further comprising:

an inductor connected between the emitter terminal of each transistor of the first and second pairs of differential transistors and ground.

20. The biased differential circuit of claim 13, wherein the first and second impedance devices comprise inductors.

* * * * *